United States Patent [19]

Yanagihara et al.

[11] Patent Number: 5,389,489
[45] Date of Patent: Feb. 14, 1995

[54] IMAGE-FORMING MATERIAL

[75] Inventors: Naoto Yanagihara; Tosiaki Endo; Naotaka Wachi, all of Shizuoka, Japan

[73] Assignee: Fuji Photo Film Co., Ltd., Kanagawa, Japan

[21] Appl. No.: 63,467

[22] Filed: May 19, 1993

[30] Foreign Application Priority Data

May 26, 1992 [JP] Japan .................... 4-133925

[51] Int. Cl.$^6$ ................ G03C 1/73
[52] U.S. Cl. .................. 430/138; 430/338; 430/343; 503/218
[58] Field of Search .......... 430/138, 343, 332, 338; 549/226, 394; 503/218, 221, 214

[56] References Cited

U.S. PATENT DOCUMENTS

| | | | |
|---|---|---|---|
| 4,078,934 | 3/1978 | Neumer | 430/343 |
| 4,379,835 | 4/1983 | Lowrey et al. | 430/338 |
| 4,727,056 | 2/1988 | Sano et al. | 503/218 |
| 4,728,633 | 3/1988 | Satomura et al. | 503/221 |
| 4,749,796 | 6/1988 | Sensui et al. | 549/225 |
| 4,962,009 | 10/1990 | Washizu et al. | 430/138 |
| 5,051,333 | 9/1991 | Yanagihara et al. | 430/438 |

FOREIGN PATENT DOCUMENTS

| | | | |
|---|---|---|---|
| 59-207282 | 11/1984 | Japan | 503/221 |
| 60-116491 | 6/1985 | Japan | 503/221 |
| 1-174486 | 7/1989 | Japan | 503/218 |
| 2-000044 | 1/1990 | Japan . | |
| 2-103180 | 4/1990 | Japan | 503/221 |

*Primary Examiner*—Charles L. Bowers, Jr.
*Assistant Examiner*—John A. McPherson
*Attorney, Agent, or Firm*—Sughrue, Mion, Zinn, Macpeak & Seas

[57] ABSTRACT

An image-forming material which includes on a support a coating layer containing at least (A) a microcapsule, which encapsulates (1) a leuco dye that forms color upon oxidative development and (2) a photooxidizing agent and (B) a reducing agent, wherein the leuco dye is a xanthene derivative represented by the following formula (1):

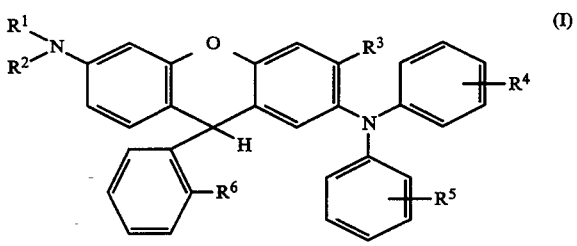

wherein $R^1$ and $R^2$, which may be the same or different, each designates a hydrogen atom, an alkyl group, an aralkyl group, or an aryl group; $R^3$ designates a hydrogen atom, an alkyl group, an aralkyl group, an aryl group, a halogen atom, an alkoxy group, an aryloxy group, an alkylthio group, or an arylthio group; $R^4$ and $R^5$ which may be the same or different, each designates a hydrogen atom, an alkyl group, an alkoxy group, a halogen atom, a trifluoromethyl group, a substituted carbonyl group, or a substituted sulfonyl group; and $R^6$ designates a hydrogen atom, an alkyl group, or a substituted carbonyl group; and wherein $R^1$ and $R^2$, and/or $R^4$ and $R^5$ may be bonded to each other to form a ring which may include an unsaturated bond or a hetero ring.

10 Claims, No Drawings

IMAGE-FORMING MATERIAL

FIELD OF THE INVENTION

The present invention relates to a heat-fixable image-forming material comprising a leuco dye which is useful for applications such as proof paper, print-out paper, overlay films and the like. Particularly, the present invention relates to an image-forming material which develops little fog prior to use, provides a high density color image, and makes a color image with a black color tone having excellent stability.

BACKGROUND OF THE INVENTION

Image-forming materials useful for applications such as proof paper, print-out paper, overlay films and the like have widely been used in various photographic applications in which imagewise exposure and development provide an image in the photosensitive portion, known as free-radical photography.

The materials which are particularly useful as such image-forming materials are based on the radical-oxidative color development of a leuco dye by a change into a corresponding dye using a photo-oxidizing agent.

Some methods have been proposed to obtain a black-colored image with such photographic image-forming materials. For example, U.S. Pat. No. 4,078,934 discloses a method for obtaining a black color image by mixing two kinds of leuco dyes, using a biimidazole compound as a photo-oxidizing agent. Also, U.S. Pat. No. 4,379,835 discloses a mixed system of leuco dyes in which a nitrate is used as a photo-oxidizing agent. However, these methods have problems such as difficulty in hue adjustment due to color amalgamation, and the like.

U.S. Pat. Nos. 4,749,796 and 5,051,333 describe, as a method using a single leuco dye, a system which employs xanthene compounds having amino groups at the 2-position and the 6-position. However, it has been found that such image-forming materials develop color (fog) prior to use after long-term storage.

SUMMARY OF THE INVENTION

In view of the above, an object of the present invention is to provide an image-forming material which develops little fog prior to use, provides a high density color image and makes a color image with a black color tone having excellent stability.

The above-described and other objects of the present invention are attained by an image-forming material comprising a support having thereon a coating layer, which contains (A) at least a microcapsule that encapsulates (1) a leuco dye that forms color upon oxidative development and (2) a photo-oxidizing agent and (B) a reducing agent wherein the leuco dye is a xanthene derivative represented by the following formula (I):

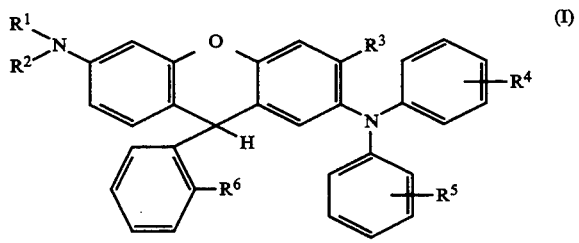

wherein $R^1$ and $R^2$, which may be the same or different, each represents a hydrogen atom, an alkyl group, an aralkyl group, or an aryl group; $R^3$ represents a hydrogen atom, an alkyl group, an aralkyl group, an aryl group, a halogen atom, an alkoxy group, an aryloxy group, an alkylthio group, or an arylthio group; $R^4$ and $R^5$, which may be the same or different, each represents hydrogen atom, an alkyl group, an alkoxy group, a halogen atom, a trifluoromethyl group, a substituted carbonyl group, or a substituted sulfonyl group; and $R^6$ represents a hydrogen atom, an alkyl group, or a substituted carbonyl group; and wherein $R^1$ and $R^2$, and/or $R^4$ and $R^5$ may be bonded to each other to form a ring which may include an unsaturated bond or a hetero ring.

In the xanthene compound of the present invention, the diphenylamino group at the 2-position serves to restrain the oxidization of the xanthene compound. Therefore, color development (fog) due to oxidization of the image-forming material prior to use can be suppressed.

Preferred embodiments of the present invention are described as follows.

(1) The microcapsule further contains an antioxidant.

(2) The content of the leuco dye with respect to the photo-oxidizing agent is from 10:1 to 1:10 on a molar basis.

(3) The reducing agent is contained in an amount of from 1 to 100 mols per mol of the photo-oxidizing agent.

In the above formula (I), the groups represented by $R^1$ and $R^2$ are preferably each an alkyl group having from 1 to 10 carbon atoms, especially from 1 to 6 carbon atoms; an aryl group having from 6 to 12 carbon atoms, especially from 6 to 10 carbon atoms; or an aralkyl group having from 7 to 12 carbon atoms, especially from 7 to 10 carbon atoms. These groups may further be substituted by an alkyl group having from 1 to 8 carbon atoms, an alkoxy group having from 1 to 6 carbon atoms, or an aryloxy group having from 6 to 10 carbon atoms.

The group represented by $R^3$ is preferably an alkyl group having from 1 to 10 carbon atoms, especially from 1 to 6 carbon atoms; an aralkyl group having from 7 to 15 carbon atoms, especially from 7 to 10 carbon atoms; an aryl group having from 6 to 12 carbon atoms, especially from 6 to 10 carbon atoms; a chlorine atom; a fluorine atom; an alkoxy group having from 1 to 10 carbon atoms, especially from 1 to 6 carbon atoms; an aryloxy group having from 6 to 12 carbon atoms, especially from 6 to 10 carbon atoms; an alkylthio group having from 1 to 10 carbon atoms, especially from 1 to 6 carbon atoms; or an arylthio group having from 1 to 10 carbon atoms, especially from 1 to 6 carbon atoms.

The groups represented by $R^4$ and $R^5$ are preferably each an alkyl group having from 1 to 16 carbon atoms, especially from 1 to 10 carbon atoms; an alkoxy group having from 1 to 10 carbon atoms, especially from 1 to 6 carbon atoms; a chlorine atom; a fluorine atom; an alkoxy carbonyl group, an alkylcarbonyl group or an N-substituted carbamoyl group each having from 2 to 16 carbon atoms, especially from 2 to 10 carbon atoms; an aryl carbonyl group having from 6 to 16 carbon atoms, especially from 6 to 10 carbon atoms; an alkyl sulfonyl group or an N-substituted sulfamoyl group each having from 1 to 10 carbon atoms, especially from 1 to 6 carbon atoms; or an aryl sulfonyl group having from 6 to 16 carbon atoms, especially from 6 to 10 carbon atoms. In the case where $R^4$ and $R^5$ each represents an alkyl group, the groups represented by $R^4$ and $R^5$ may further be substituted, preferably by an alkyl group having from 1 to 6 carbon atoms, an alkoxy group having from 1 to 10 carbon atoms, or an aryloxy group having from 6 to 10 carbon atoms.

The group represented by $R^6$ is preferably an alkyl group having from 1 to 16 carbon atoms, especially from 1 to 10 carbon atoms; an alkoxy carbonyl group, an alkyl carbonyl group or an N-substituted carbamoyl group each having from 2 to 16 carbon atoms, especially from 2 to 10 carbon atoms; or an aryl carbonyl group having from 6 to 16 carbon atoms, especially from 6 to 10 carbon atoms.

$R^1$ and $R^2$ may be bonded to each other to form a ring which may include, for example, an unsaturated bond or a hetero ring (e.g., a piperidino group, a 1-pyrrolidinyl group, a 1-pyrrolyl group or a morpholino group). $R^4$ and $R^5$ may be bonded to each other to form a ring which may include, for example, an unsaturated bond or a hetero ring (e.g., a carbazole ring, a phenoxazine ring or a phenothiazine ring).

The selection of $R^3$, $R^4$ and $R^5$ is important for obtaining a sharp, black color tone. For example, in the case where $R^3$ is a hydrogen atom, it is preferred that: one of $R^4$ and $R^5$ is a hydrogen atom, an alkyl group or an alkoxy group and the other is a trifluoromethyl group, an alkoxy carbonyl group, an alkyl carbonyl group, an aryl carbonyl group, an N-substituted carbamoyl group, an aryl sulfonyl group, an alkyl sulfonyl group or an N-substituted sulfamoyl group; or each of $R^4$ and $R^5$ is a halogen atom. In the case where $R^3$ is an alkyl group, a halogen atom, an alkoxy group, an aryloxy group, an alkylthio group or an arylthio group, $R^4$ and $R^5$ are each preferably a hydrogen atom, an alkyl group or an alkoxy group.

For easy availability of raw materials, $R^1$ and $R^2$ each is preferably an ethyl group, a butyl group, an isobutyl group, an isoamyl group, a methoxypropyl group or a p-tolyl group.

For the same purpose, $R^3$ is preferably a hydrogen atom, a methyl group, a chlorine atom, a methoxy group, an ethoxy group or a methylthio group.

Also, for the same purpose, $R^4$ and $R^5$ are preferably a hydrogen atom, a methyl group, an ethyl group, a methoxy group, a fluorine atom, a chlorine atom, a trifluoromethyl group, a methyl sulfonyl group or an N,N-dibutyl sulfamoyl group.

Also, for the same purpose, $R^6$ is preferably a methoxymethyl group, a phenoxymethyl group, a p-methoxyphenoxymethyl group, a methoxy carbonyl group, an ethoxy carbonyl group, a butoxy carbonyl group, an N,N-dimethyl carbamoyl group or a N-methyl-N-phenyl carbamoyl group.

Specific, nonlimiting examples of the xanthene derivative of formula (I) for use in the present invention are listed below:

9-(2-methoxycarbonylphenyl)-2-diphenylamino-3-methoxy-6-diethylaminoxanthene, 9-(2-methoxycarbonylphenyl)-2-diphenylamino-3-methoxy-6-dibutylaminoxanthene, 9-(2-methoxycarbonylphenyl)-2-diphenylamino-3-methoxy-6-N-ethyl-N-isobutylaminoxanthene, 9-(2-methoxycarbonylphenyl)-2-diphenylamino-3-methoxy-6-N-ethyl-N-isoamylaminoxanthene, 9-(2-methoxycarbonylphenyl)-2-diphenylamino-3-methoxy-6-N-ethyl-p-tolylaminoxanthene, 9-(2-methoxycarbonylphenyl)-2-di-p-tolylamino-3-methoxy-6-diethylaminoxanthene, 9-(2-methoxycarbonylphenyl)-2-di-p-tolylamino-3-methoxy-6-dibutylaminoxanthene, 9-(2-methoxycarbonylphenyl)-2-diphenylamino-3-methoxy-6-N-ethyl-N-isobutylaminoxanthene, 9-(2-methoxycarbonylphenyl)-2-di-p-tolylamino-3-methoxy-6-N-ethyl-N-isoamylaminoxanthene, 9-(2-methoxycarbonylphenyl)-2-di-p-tolylamino-3-methoxy-6-N-ethyl-N-p-tolylaminoxanthene, and 9-(2-methoxycarbonylphenyl)-2-di-m-tolylamino-3-methoxy-6-diethylaminoxanthene;

9-(2-methoxycarbonylphenyl)-2-di-o-tolylamino-3-methoxy-6-diethylaminoxanthene, 9-(2-methoxycarbonylphenyl)-2-di-p-anisylamino-3-methoxy-6-diethylaminoxanthene, 9-(2-methoxycarbonylphenyl)-2-di-m-anisylamino-3-methoxy-6-diethylaminoxanthene, 9-(2-methoxycarbonylphenyl)-2-di-o-anisylamino-3-methoxy-6-diethylaminoxanthene, 9-(2-methoxycarbonylphenyl)-2-diphenylamino-3-methylthio-6-diethylaminoxanthene, 9-(2-methoxycarbonylphenyl)-2-diphenylamino-3-phenylthio-6-diethylaminoxanthene, 9-(2-methoxycarbonylphenyl)-2-N-p-tolyl-N-phenylamino-3-methoxy-6-diethylaminoxanthene, 9-(2-methoxycarbonylphenyl)-2-N-m-tolyl-N-phenylamino-3-methoxy-6-diethylaminoxanthene, 9-(2-methoxycarbonylphenyl)-2-N-o-tolyl-N-phenylamino-3-methoxy-6-diethylaminoxanthene, 9-(2-methoxycarbonylphenyl)-2-N-p-anisyl-N-phenylamino-3-methoxy-6-diethylaminoxanthene, 9-(2-methoxycarbonylphenyl)-2-N-m-anisyl-N-phenylamino-3-methoxy-6-diethylaminoxanthene, 9-(2-methoxycarbonylphenyl)-2-N-o-anisyl-N-phenylamino-3-methoxy-6-diethylaminoxanthene, 9-(2-methoxycarbonylphenyl)-2-di-p-tolylamino-3-ethoxy-6-diethylaminoxanthene, 9-(2-methoxycarbonylphenyl)-2-diphenylamino-3-ethoxy-6-diethylaminoxanthene, 9-(2-methoxycarbonylphenyl)-2-di-p-tolylamino-3-phenoxy-6-diethylaminoxanthene, 9-(2-ethoxycarbonylphenyl)-2-di-p-tolylamino-3-ethoxy-6-diethylaminoxanthene, and 9-(2-butoxycarbonylphenyl)-2-diphenylamino-3-ethoxy-6-diethylaminoxanthene;

9-(2-phenoxymethylphenyl)-2-di-o-tolylamino-3-ethoxy-6-dibutylaminoxanthene, 9-(2-p-anisyloxymethylphenyl)-2-di-o-tolylamino-3-ethoxy-6-dibutylaminoxanthene, 9-(2-N,N-dimethylcarbamoylphenyl)-2-diphenylamino-3-ethoxy-6-diethylaminoxanthene, 9-(2-N-methyl-N-phenylcarbamoylphenyl)-2-diphenylamino-3-methoxy-6-diethylaminoxanthene, 9-(2-methoxycarbonylphenyl)-2-N-phenyl-N-p-trifluoromethylphenylamino-6-diethylaminoxanthene, 9-(2-methoxycarbonylphenyl)-2-N-phenyl-N-p-trifluoromethylphenylamino-6-dibutylaminoxanthene, 9-(2-methoxycarbonylphenyl)-2-N-phenyl-N-p-trifluoromethylphenylamino-6-N-ethyl-N-isobutylaminoxanthene, 9-(2-methoxycarbonylphenyl)-2-N-phenyl-N-p-trifluoromethylphenylamino-6-N-ethyl-N-isoamylaminoxanthene, 9-(2-methoxycarbonylphenyl)-2-N-phenyl-N-p-trifluoromethylphenylamino-6-N-ethyl-N-p-tolylaminoxanthene, 9-(2-methoxycarbonylphenyl)-2-N-phenyl-N-m-trifluoromethylphenylamino-6-diethylaminoxanthene, 9-(2-methoxycarbonylphenyl)-2-N-phenyl-N-m-trifluoromethylphenylamino-6-dibutylaminoxanthene, 9-(2-methoxycarbonylphenyl)-2-N-phenyl-N-o-trifluoromethylphenylamino-6-diethylaminoxanthene, 9-(2-methoxycarbonylphenyl)-2-N-p-tolyl-N-m-trifluoromethylphenylamino-6-diethylaminoxanthene, 9-(2-methoxycarbonylphenyl)-2-N-phenyl-N-p-acetylphenylamino-6-diethylaminoxanthene, and 9-(2-methoxycarbonylphenyl)-2-N-phenyl-N-p-benzoylphenylamino-6-diethylaminoxanthene;

9-(2-methoxycarbonylphenyl)-2-N-phenyl-N-p-methylsulfonylphenylamino-6-diethylaminoxanthene, 9-(2-methoxycarbonylphenyl)-2-N-phenyl-N-p-phenylsulfonylphenylamino-6-diethylaminoxanthene, 9-(2-methoxycarbonylphenyl)-2-N-phenyl-N-p-N',N'-diethylsulfamoylphenylamino-6-diethylaminoxanthene, 9-(2-methoxycarbonylphenyl)-2-N-phenyl-N-m-N',N'-diethylsulfamoylphenylamino-6-diethylaminoxanthene, 9-(2-methoxycarbonylphenyl)-2-di-p-chlorophenylamino-6-diethylaminoxanthene, 9-(2-methoxycarbonylphenyl)-2-di-m-chlorophenylamino-6-diethylaminoxanthene, 9-(2-methoxycarbonylphenyl)-2-di-o-chlorophenylamino-6-diethylaminoxanthene, 9-(2-methoxycarbonylphenyl)-2-di-p-fluorophenylamino-6-diethylaminoxanthene, 9-(2-methoxycarbonylphenyl)-2-di-m-fluorophenylamino-6-diethylaminoxanthene, 9-(2-methoxycarbonylphenyl)-2-di-o-fluorophenylamino-6-diethylaminoxanthene, 9-(2-ethoxycarbonylphenyl)-2-N-phenyl-N-m-trifluoromethylphenylamino-6-diethylaminoxanthene, 9-(2-butoxycarbonylphenyl)-2-N-phenyl-N-p-trifluoromethylphenylamino-6-diethylaminoxanthene, 9-(2-phenoxymethylphenyl)-2-N-phenyl-N-p-trifluoromethylphenylamino-6-dibutylaminoxanthene, 9-(2-p-anisyloxymethylphenyl)-2-N-phenyl-N-m-trifluoromethylphenylamino-6-dibutylaminoxanthene, 9-(2-N,N-dimethylcarbamoylphenyl)-2-N-phenyl-N-m-trifluoromethylphenylamino-6-diethylaminoxanthene, and 9-(2-N-methyl-N-phenylcarbamoylphenyl)-2-N-phenyl-N-m-trifluoromethylphenylamino-6-diethylaminoxanthene; and 9-(2-methoxycarbonylphenyl)-2-diphenylamino-3-methyl-6-diethylaminoxanthene, 9-(2-methoxycarbonylphenyl)-2-di-p-tolylamino-3-methyl-6-diethylaminoxanthene, 9-(2-methoxycarbonylphenyl)-2-di-p-anisylamino-3-methyl-6-diethylaminoxanthene, 9-(2-methoxycarbonylphenyl)-2-diphenylamino-3-chloro-6-diethylaminoxanthene, 9-(2-methoxycarbonylphenyl)-2-diphenylamino-3-fluoro-6-diethylaminoxanthene, 9-(2-methoxycarbonylphenyl)-2-diphenylamino-6-diethylaminoxanthene, and 9-(2-methoxycarbonylphenyl)-2-diphenylamino-6-diphenylaminoxanthene.

The xanthene derivative which can be used in the present invention is easily obtained by reducing a fluoran phthalide derivative, which is a colorless basic dye for use in pressure-sensitive paper, heat-sensitive paper or the like, under appropriate conditions, to produce 9-(2-carboxyphenyl)-2,6-diaminoxanthene followed by esterification or the like.

Although a variety of reducing agents can be used for reducing the fluoran phthalide derivative, it is preferred to use zinc dust under acid conditions in view of handleability. A functional group-converting reaction, such as esterification of a carboxy group of the 9-phenyl group at the 2-position thereof, is carried out in a conventional manner.

In accordance with the present invention, other leuco dyes may be used in combination with the xanthene derivative represented by the formula (I) in order to adjust the color tone. The examples of the leuco dyes which may be used in combination with the xanthene derivative of the present invention preferably include, for example, the compounds described in U.S. Pat. Nos. 3,445,234, and 4,749,796, JP-A-62-94841, JP-A-63-15787 or the like (The term "JP-A" as used herein means an unexamined published Japanese patent application). Such compounds are preferably used in an amount such that the molar ratio of the amount of the xanthene derivative to that of the compounds is from 100:0.1 to 1:10.

The above-mentioned other leuco dye compounds, include, for example, the following compounds:

(A) aminotriarylmethane, aminoxanthene, aminothioxanthene, amino-9,10-dihydroacridine, aminophenoxazine, aminophenothiazine, aminodihydrophenazine, aminodiphenylmethane, and leuco indamine; and (B) aminohydrocrocinnamate (cyanoethane, leuco methine), hydrazine, a leuco indigoid dye) amino-2,3-dihydroanthraquinone, tetrahalo-p,p-biphenol, 2-(p-hydroxyphenyl)-4,5-diphenylimidazole, and phenethylaniline.

In the above-listed (A) compounds, a hydrogen atom is released to form a parent dye, while in the above-listed (B) compounds, two hydrogen atoms are released to form a parent dye.

Specific examples of leuco dye compounds are as follows:

Tris-(4-dimethylaminophenyl)-methane, tris-(4-diethylamin-2-methylphenyl)-methane, bis-(4-diethylamino-2-methylphenyl)-4-diethylaminophenyl)-methane, bis-(1-ethyl-2-methylindole-3-yl)-phenylmethane, 9-(2-methoxycarbonylphenyl)-2-m-trifluoromethylanilino-6-diethylaminoxanthene, 9-(2-methoxycarbonylphenyl)-2-N-(3-trifluoronethylphenyl)-N-ethylamino-6-diethylaminoxanthene, 9-(2-methoxycarbonylphenyl)-2-o-chloroanilino-6-dibutylaminoxanthene, 9-(2-methoxycarbonylphenyl)-2-dibenzylamino-6-diethylaminoxanthene, 9-(2-methoxycarbonylphenyl)-benzo[a]-6-diethylaminoxanthene, 9-(2methoxycarbonylphenyl)-3,6-dimethoxyxanthene, 9-(2-methoxycarbonylphenyl)-3,6-diphenylaminoxanthene, benzoyl leuco methylene blue, 3,7-bis-diethylaminophenoxazine, and the like.

The image-forming material of the present invention is similar to that described in JP-A-2-44, except that the xanthene derivative represented by present formula (I) is used as a leuco dye in the present invention.

The preferred photo-oxidizing agent which can be used in the image-forming material of the present invention is inactive when it is not exposed to an active radiation such as visible light, ultraviolet light, infrared light, an X-ray or the like, but forms a chemical species which oxidizes a leuco dye to its color-developing form when exposed to the above radiation.

Examples of the photo-oxidizing agent for use in the present invention include lophine dimer compounds such as 2,4,5-triarylimidazole dimer disclosed in U.S. Pat. Nos. 4,247,618, 4,311,783 and 4,252,887; azide compounds such as 2-azidobenzoxazole, benzoyl azide and 2-azidobenzimidazole as disclosed in U.S. Pat. No. 3,282,693; pyridinium compounds such as 3-ethyl-1-methoxy-2-pyridothiacyanine perchlorate and 1-methoxy-2-methylpyridinium-p-toluenesulfonate as disclosed in U.S. Pat. No. 3,615,568; organic halogen compounds such as N-bromosuccinimide, tribromomethylphenylsulfone, 2-trichloromethyl-5-(p-butoxystyryl)-1,3,4-oxadiazole and 2,6-ditrichloromethyl-4-(p-methoxyphenyl)triazine; and azido polymers described in Shunki Kenkyu Happyokai Koen Yoshi, ed. Nippon Shashin Gakkai, (the preprint of the spring Meeting of Japan Photography Society) page 55 (1968). Among them, the lophine dimers and the organic halogen compounds are preferable, and combinations of these two kinds of substances are particularly preferred for high sensitivity.

In producing the image-forming material of the present invention it is preferred to mix the leuco dye and the photo-oxidizing agent in such a manner that the molar ratio of the former to the latter is from 10:1 to 1:10, more preferably from 2:1 to 1:2.

The microcapsule, according to the present invention, which can be used for encapsulating the leuco dye and the photo-oxidizing agent preferably prevents mutual contact of the substance encapsulated in the microcapsule with a substance arranged outside the microcapsule by the isolating action of the microcapsule wall at ordinary temperatures. Also, the microcapsule has an increased permeability to the substances (encapsulated therein or present outside the microcapsule) only upon heating to a certain temperature or more. The permeation initiation temperature can be controlled by suitably selecting a capsule wall material, a capsule core material and an additive. The permeation initiation temperature corresponds to the glass transition temperature of the capsule wall material. The glass transition temperature of the capsule wall can be controlled by changing the capsule wall materials.

Examples of useful capsule wall materials include polyurethanes, polyureas, polyamide, polyester, polycarbonate and the like, and a blend thereof, with polyurethanes and polyureas being particularly preferable.

The microcapsule of the present invention is formed by emulsifying a core material containing an image-forming substance such as a leuco dye, a photo-oxidizing agent and the like, and subsequently forming a wall around the resulting emulsified oil drop. In the preparation of the microcapsule, a reactant which forms the wall is added to the inside and/or the outside of the oil drop.

As an organic solvent for dissolving the above-mentioned image-forming substance, an oil having a high boiling point (e.g. an oil having a boiling point of 120° C. or more) is preferably used.

Examples of such an oil include phosphoric acid esters, phthalic acid esters, acrylic acid esters, methacrylic acid esters, other carboxylic acid esters, fatty acid amides, alkylated biphenyls, alkylated terphenyls, alkylated naphthalenes, diarylethanes, chlorinated paraffins, and the like. Specific examples of the organic solvent include those described in JP-A-60-242094 and JP-A-62-75409.

An auxiliary solvent having a low boiling point (such as that having a boiling point of less than 120° C.) may be added to the above-described organic solvent. Specific examples of the auxiliary solvent include ethyl acetate, isopropyl acetate, butyl acetate, methylene chloride, cyclohexanone, etc.

A protective colloid or a surfactant may be added to the aqueous phase for stabilizing the emulsified oil drop. Water-soluble polymers (for example, polyvinyl alcohol, gelatin, cellulose derivatives, or the like) are generally suitable as the protective colloid.

The microcapsule of the present invention preferably has a volume average diameter of 20 μm or less, more preferably 4 μm or less, according to the measuring method described in JP-A-60-214990, particularly for improving image resolution and ease of handling. The lower limit of the volume average diameter of the microcapsule is generally 0.1 μm or less, although it partly depends on the nature of the substrate or the support.

In the image-forming material of the present invention, an antioxidant may be contained in the micro-capsule in order to improve the stability of the image-forming material prior to use. As the antioxidant, phenolic compounds, hydroquinone compounds, catechol compounds, aniline compounds, aminophenolic compounds and the like are preferred. Specific examples of the antioxidant include 2,6-di-t-butyl-4-methylphenol, 2,4,6-tri-t-butylphenol, 2,6-di-t-amyl-4-methylphenol, 2,6-di-t-octyl-4-methylphenol, 2,6-di-i-butyl-4-methylphenol, 2,4,6-tri-i-butylphenol, 2-t-butyl-4-methoxyphenol, 2,6-di-t-butyl-4-methoxyphenol, 2-t-butyl-4-phenylthiophenol, 2-t-butyl-4-phenylthio-5-methylthiophenol, 2,5-di-t-butylhydroquinone, 2,5-di-t-amylhydroquinone, 2,5-di-t-octylhydroquinone, 2,5-di-t-hexylhydroquinone, 3,6-di-t-butylcatechol, 3,6-di-t-octylcatechol, dimethylaniline, diethylaniline, di-n-butylaniline, di-n-octylaniline, N,N-diethyl-p-toluidine, N,N-diethyl-m-toluidine, N,N-dimethyl-p-anisidine, N,N-diethyl-m-phenetidine, p-acetoamino-N,N-dibutylaniline, julolidine, 1,2-bis-(3-diethylaminophenoxy)ethane, 1,3-bis-(3-diethylaminophenoxy)propane, 1,4-bis-(3-diethylaminophenoxy)butane, 1-(3-diethylaminophenoxy)-2-(4-methoxyphenoxy)ethane, 4-(methoxyphenyl)-phenylamine, (4-methoxy-2-methylphenyl)phenylamine, bis-(4-methoxyphenyl)amine, and the like.

In producing the image-forming material of the present invention, it is preferred to mix the photo-oxidizing agent and the antioxidant in such a manner that the molar ratio of the amount of the former to that of the latter is from 10:0.001 to 10:2, more preferably from 10:0.01 to 10:1.

A stable image can be reliably obtained on the image-forming material of the present invention by imagewise exposure to form an image and subsequent heat treatment thereof. Specifically, the image is fixed by a mechanism in which the heat treatment causes the photo-oxidizing agent to contact with the reducing agent through the microcapsule wall, so that the oxidizing action is nullified by the reducing action of the reducing agent even if photo-oxidizing agent is activated, whereby the leuco dye no longer forms color.

Such a reducing agent acts as a so-called free-radical scavenger, which traps a free radical of the activated photo-oxidizing agent.

Examples of the reducing agent for use in the present invention include hydroquinone compounds and aminophenol compounds having a hydroxyl group on the benzene ring and another hydroxyl group or an amino group at another position of the benzene ring as disclosed in JP-A-2-44; cyclic phenyl hydrazide compounds; compounds selected from guanidine derivatives, alkylenediamine derivatives and hydroxylamine compounds; phenylhydrazine compounds; and the like. Specific examples of the reducing agent include hydroquinone, catechol, resorcinol, hydroxyhydroquinone, pyrrologlycinol, aminophenol, 2,5-di-t-butylhydroquinone, 2,5-di-t-amylhydroquinone, 1-phenylpyrazolidine-3-one (phenidone A), 1-phenyl-4-methylpyrazolidine-3-one (phenidone B), 1-phenyl-4-methyl-4-hydroxymethylpyrazolidine-3-one, 3-methyl-1-(p-sulfophenyl)-2-pyrazoline-5-one, 3-methyl-1-phenyl-2-pyrazoline-5-one, and the like.

In the image-forming material of the present invention, the reducing agent is not encapsulated in the microcapsule but is dispersed in a solid form by means of a sand mill or the like or is dissolved in an oil and dispersed to form an emulsion. Protective colloid is preferably used in forming the solid dispersion or the emulsified dispersion.

The reducing agent is preferably present in an amount of from 1 to 100 moles, more preferably from 5 to 20 moles per mole of the photo-oxidizing agent.

In accordance with the present invention, as mentioned above, the image is fixed effectively by heating to bring the photo-oxidizing agent into contact with the reducing agent through the capsule wall. Simultaneous heating and pressing may exhibit a synergistic effect on fixing of an image. A melting point-lowering agent such as p-benzyloxyphenol, p-toluene-sulfonamide or the like may be preferably used in combination with the reducing agent, which enables an image to be fixed at a relatively low temperature.

In the present invention, a known sensitizing agent may be contained in the microcapsule.

The image-forming material of the present invention can be prepared by the same method as that described in JP-A-2-44 except for the use of the xanthene derivative represented by present formula (I) as a leuco dye, in place of the dye of JP-A-2-44.

Specifically, the image-forming material of the present invention can be prepared by applying a dispersion of (A) microcapsules, which encapsulate the specific leuco dye of formula (I) and a photo-oxidizing agent, and (B) a reducing agent onto a support.

The above-described dispersion of microcapsules containing the leuco dye and the photo-oxidizing agent and the reducing agent may further include a binder, a pigment, a wax, a metal soap and/or a surfactant.

In the present invention, the image-forming material is preferably present in an amount of from 3 to 30 g/m$^2$, particularly preferably from 5 to 20 g/m$^2$ based on the solid content.

Examples of a material suitable for the support of the present invention include, for example, a variety of paper from tissue paper to cardboard, and a film made of a polymer such as regenerated cellulose, cellulose acetate, cellulose nitrate, polyethylene terephthalate, polyethylene, polyvinylacetate, polymethylmethacrylate, polyvinylchloride or the like.

The coating liquid for the image-forming layer may be applied onto the support by means of air knife coating, curtain coating, slide coating, roller coating, dip coating, wire bar coating, blade coating, gravure coating, spin coating, extrusion coating, etc. The method for applying the coating liquid is not, however, limited to the above-mentioned methods.

If necessary, a primary coating layer may be provided on the support, or a protective layer may be provided on the image-forming layer. The primary coating layer and the protective layer contain a binder and/or a pigment.

A method for forming an image on the image-forming material of the present invention and fixing the resulting image is the same as the method described in JP-A-2-44. The imagewise exposure on the image-forming material of the present invention can be carried out, for example, by writing with activating light or by exposing a selected region of a negative, a stencil or any one of the other relatively opaque patterns with a suitable light source such as a fluorescent lamp, a mercury lamp, a metal halide lamp, a xenon lamp, a tungsten lamp, etc. Consequently, the photo-oxidizing agent is activated and an image of the leuco dye is formed.

The obtained image is fixed by heating the microcapsule wall material at its glass transition temperature or higher to bring the photo-oxidizing agent into contact with the reducing agent through the capsule wall. Pressing may be conducted simultaneously with the heating.

The present invention will be described in further detail based on the following examples. The present invention is not, however, limited to the examples. The term "part (s)" used hereinbelow means "part(s) by weight".

EXAMPLES

Preparation of the leuco dye (1)

To a 250 cc solution of 28.4 parts of 2-diphenylamino-3-methoxy-6-diethylaminofluoran in acetic acid, 20 parts of zinc dust was added in several installments at 95° C., and stirred at 105° C. for one hour. A supernatant of the resulting reaction solution was poured into 2 λ of water. Then, the deposited crystals were filtered off and dried to obtain 9-(2-carboxyphenyl)-2-diphenylamino-3-methoxy-6-diethylaminoxanthene.

The carboxylic acid thus obtained and 10 parts of potassium carbonate were mixed in 200 cc of N,N-dimethylacetamide, to which 6.5 parts of dimethyl sulfate was added dropwise at 45° C. followed by stirring at the same temperature for one hour. The resulting reaction mixture was poured into 2 λ of water. Then, the deposited crystals were filtered off and recrystallized with methanol-ethylacetate to obtain 25.7 parts of 9- ( 2-methoxycarbonylphenyl ) -2-diphenylamino-3-methoxy-6-diethylaminoxanthene having a melting point of 117° to 119° C.

Preparation of the leuco dye (2)

26.1. parts of 9-(2-methoxycarbonylphenyl)-2-N-phenyl-N-m-trifluoromethylphenylamino-6-diethylaminoxanthene having a melting point of 70° to 72° C. was obtained by the same method as that used in Preparation of the leuco dye (1) except that 30.3 parts of 2-N-phenyl-N-m-trifluoromethylphenylamino-6-diethylaminofluoran was used in place of 28.4 parts of 2-diphenylamino-3-methoxy-6-diethylaminofluoran as a starting material.

EXAMPLE 1

One part of 9-(2-methoxycarbonylphenyl)-2-di-p-tolylamino-3-methoxy-6-diethylaminoxanthene [as a leuco dye]; 2 parts of 2,2'-bis-(o-chlorophenyl)-4,4',5,5'-tetraphenylbiimidazole [as a photo-oxidizing agent]; 0.4 part of 2,6-ditrichloromethyl-4-(p-methoxyphenyl)triazine; 0.1 part of 2,6-di-t-octylphenol; and 10 parts of a 75 wt % solution of xylylenediisocyanate/trimethylolpropane adduct in ethyl acetate were added to and dissolved in a mixed solvent of 16 parts of ethyl acetate and 14 parts of dicyclohexyl phthalate. The resulting solution was added to 64 parts of an aqueous 5 wt % solution of carboxyl-modified polyvinyl alcohol, and dispersed and emulsified at 20° C. to obtain a liquid emulsion having an average particle diameter of 1 μm. To the resulting emulsion, 58 parts of water was added, and stirred at 40° C. for 3 hours. Thereafter, the emulsion was brought to room temperature, and filtered to obtain a capsule liquid dispersion.

Separately, 9.4 parts of 1-phenylpyrazolidine-3-one (phenidone A) [as a reducing agent] and 0.9 part of p-toluenesulfonamide were added to 23 parts of an aqueous 6 wt % carboxyl-modified polyvinyl alcohol solution and dispersed by means of a lateral sand mill to obtain a dispersion containing a reducing agent having an average particle diameter of 1 μm.

The coating liquid having the following composition was prepared.

| | |
|---|---|
| Capsule dispersion as prepared above | 165.4 parts |
| Phenidone A liquid dispersion as prepared above | 33.3 parts |
| 20% Silica dispersion (Siloid 404 available from Fuji Davidson Kagaku K.K.) | 7 parts |
| 30% epoxidated-polyamide resin (FL-71 available from Toho Chemical Industrial Co., Ltd.) | 3 parts |
| Aqueous 10% sulfosuccinic-4-methyl-pentyl ester solution | 3 parts |

This coating liquid was applied on a sheet of wove paper (a basis weight of 76 g/m$^2$) in a solid content of 10 g/m$^2$ by means of a coating rod, and dried at 50° C. to obtain an image-forming material.

EXAMPLE 2

An image-forming material was prepared in the same manner as in Example 1 except that 9-(2-methoxycarbonylphenyl)-2-diphenylamino-3-methoxy-6-diethylamoxanthene was used in place of 9-(2-methoxycarbonylphenyl) -2-di-p-tolylamino-3-methoxy-6-diethylaminoxanthene.

EXAMPLE 3

An image-forming material was prepared in the same manner as in Example 1 except that 9-(2-methoxycarbonylphenyl)-2-N-phenyl-N-p-trifluorophenylamino-6-diethylaminoxanthene was used in place of 9-(2-methoxycarbonylphenyl) -2-di-p-tolylamino-3-methoxy-6-diethylaminoxanthene.

EXAMPLE 4

An image-forming material was prepared in the same manner as in Example 1 except that 9-(2-methoxycarbonylphenyl)-2-N-phenyl-N-m-trifluoromethylphenylamino-6-diethylaminoxanthene was used in place of 9-(2-methoxycarbonylphenyl)-2-di-p-tolylamino-3-methoxy-6-diethylaminoxanthene.

EXAMPLE 5

An image-forming material was prepared in the same manner as in Example 1 except that 9-(2-methoxycarbonylphenyl)-2-p-dichlorophenylamino-6-diethylaminoxanthene was used in place of 9-(2-methoxycarbonylphenyl)-2-di-p-tolyamino-3-methoxy-6-diethylaminoxanthene.

EXAMPLE 6

0.9 part of 9-(2-methoxycarbonylphenyl)-2-di-p-tolylamino-3-methoxy-6-diethylaminoxanthene; 0.1 part of 9-(2-methoxycarbonylphenyl)-2-m-trifluoromethylanilino-6-diethylaminoxanthene; 2 parts of 2,2'-bis-(o-chlorophenyl-4,4',5,5'-tetraphenylbiimidazole; 0.4 part of 2,6-ditrichloromethyl-4-(p-methoxyphenyl)triazine; and 10 parts of a 75 wt % solution of xylylenediisocyanate/trimethylolpropane adduct in ethyl acetate were added to and dissolved in a mixed solvent of 16 parts of ethyl acetate and 14 parts of dicyclohexyl phthalate. The resulting solution was added to 64 parts of an aqueous 5 wt % solution of carboxyl-modified polyvinyl alcohol, and dispersed and emulsified at 20° C. to obtain a liquid emulsion having an average particle diameter of 1 μm. To the resulting emulsion, 58 parts of water was added, and stirred at 40° C. for 3 hours. Thereafter, the emulsion was brought to room temperature, and filtered to obtain a capsule liquid dispersion.

Then, an image-forming material was prepared in the same manner as in Example 1 except that the capsule liquid dispersion as prepared in this example was used in place of the capsule liquid dispersion used in Example 1.

COMPARATIVE EXAMPLE 1

An image-forming material was prepared in the same manner as in Example 1 except that 9-(2-methoxycarbonylphenyl)-2-phenylamino-3-methoxy-6-diethylaminoxanthene was used in place of 9-(2-methoxycarbonylphenyl)-2-di-p-tolylamino-3-methoxy-6-diethylaminoxanthene.

COMPARATIVE EXAMPLE 2

An image-forming material was prepared in the same manner as in Example 1 except that 9-(2-methoxycarbonylphenyl)-2-m-trifluoromethylanilino-6-diethylaminoxanthene was used in place of 9-(2-methoxycarbonylphenyl)-2-di-p-tolylamino-3-methoxy-6-diethylaminoxanthene.

COMPARATIVE EXAMPLE 3

An image-forming material was prepared in the same manner as in Example 1 except that 9-(2-methoxycarbonylphenyl)-2-anilino-6-diethylaminoxanthene was used in place of 9-(2-methoxycarbonylphenyl)-2-di-p-tolylamino-3-methoxy-6-diethylaminoxanthene.

EXAMPLE 7

One part of 9-(2-methoxycarbonylphenyl)-2-di-p-tolylamino-3-methoxy-6-diethylaminoxanthene; 2 parts of 2,2'-bis-(o-chlorophenyl)-4,4',5,5'-tetraphenylbiimidazole; 0.4 part of 2,6-ditrichloromethyl-4-(p-methoxyphenyl)triazine; 0.1 part of 2,6-di-t-octylphenol [as an antioxidant]; and 10 parts of a 75 wt % solution of xylylenediisocyanate/trimethylolpropane adduct in ethyl acetate were added to and dissolved in a mixed solvent of 16 parts of ethyl acetate and 14 parts of dicyclohexylphthalate. The resulting solution was added to 64 parts of an aqueous 5 wt % solution of carboxyl-modified polyvinyl alcohol, and dispersed and emulsified at 20° C. to obtain a liquid emulsion having an average particle diameter of 1 μm. To the resulting emulsion, 58 parts of water was added, and stirred at 40° C. for 3 hours. Thereafter, the emulsion was brought to room temperature, and filtered to obtain a capsule liquid dispersion.

Then, an image-forming material was prepared in the same manner as in Example 1 except that the capsule liquid dispersion as prepared in this example was used in place of the capsule liquid dispersion used in Example 1.

EXAMPLE 8

An image-forming material was prepared in the same manner as in Example 7 except that 0.9 part of 9-(2-methoxycarbonylphenyl)-2-di-p-tolylamino-3-methoxy-6-diethylaminoxanthene and 0.1 part of 9-(2-methoxycarbonylphenyl)-2-m-trifluoromethylanilino-6-diethylaminoxanthene were used in place of one part of 9-(2-methoxycarbonylphenyl)-2-di-p-tolylamino-3-methoxy-6-diethylaminoxanthene.

COMPARATIVE EXAMPLE 4

An image-forming material was prepared in the same manner as in Example 7 except that 9-(2-methoxycarbonylphenyl)-2-phenylamino-3-methoxy-6-diethylaminoxanthene was used in place of 9-(2-methoxycarbonylphenyl)-2-di-p-tolylamino-3-methoxy-6-diethylaminoxanthene.

Tests were conducted on the image-forming materials prepared in Examples 1 to 7 and Comparative Examples 1 to 4 in the following manners.

(1) Image density

Each of the fresh samples was exposed through a line original to light by use of Jet Light (an ultra-high pressure mercury vapor lamp available from ORC K.K.) to obtain a black image. Thereafter, each of the samples was passed through a roller heated to 135° C. at a rate of 450 mm/min., so that the unexposed portions were subjected to fixation treatment. Then, the image density of the exposed portions were measured with a Macbeth reflection densitometer.

(2) Fog prior to use

The fresh samples were stored in a dark place under the conditions of a temperature of 45° C. and a relative humidity of 30% for a week. Then, the fog density of each sample was measured with a Macbeth reflection densitometer.

(3) Stability of image

The samples which had been subjected to thermal fixation treatment were exposed to fluorescent light of 32000 luxes for 10 hours. Then, the image density of each sample was measured with a Macbeth reflection densitometer, and compared to the image density of the same Sample which was measured before the sample was exposed to the fluorescent light.

TABLE 1

|  | Image density | Fog prior to use | Stability of image |
| --- | --- | --- | --- |
| Example 1 | 1.06 | 0.08 | 0.99 |
| Example 2 | 1.05 | 0.08 | 0.98 |
| Example 3 | 1.03 | 0.07 | 0.99 |
| Example 4 | 1.03 | 0.07 | 0.98 |
| Example 5 | 1.02 | 0.06 | 0.95 |
| Example 6 | 1.08 | 0.09 | 1.01 |
| Comparative Example 1 | 1.01 | 0.75 | 0.90 |
| Comparative Example 2 | 1.02 | 0.61 | 0.84 |
| Comparative Example 3 | 0.99 | 0.71 | 0.87 |
| Example 7 | 1.02 | 0.06 | 0.96 |
| Example 8 | 1.04 | 0.07 | 0.99 |
| Comparative Example 4 | 0.98 | 0.53 | 0.85 |

As can be seen from Table 1, the image-forming material prepared in each example according to the present invention develops less fog prior to use, provides a higher density in a colored image, and makes a color image with a black color hue having more excellent stability, compared to the corresponding performances of the image-forming material prepared in each comparative example, which uses a leuco dye outside the scope of formula (I) in the present invention.

While the invention has been described in detail and based on the above specific examples, it will be apparent to one skilled in the art that various changes and modifications can be made without departing from the spirit and scope of the present invention.

What is claimed is:

1. An image-forming material comprising a support having thereon a coating layer containing (A) at least a microcapsule, wherein the microcapsule encapsulates (1) a leuco dye that forms a black color tone upon oxidative development and (2) a photo-oxidizing agent, and (B) a reducing agent, wherein the leuco dye is a xanthene derivative represented by the following formula (I):

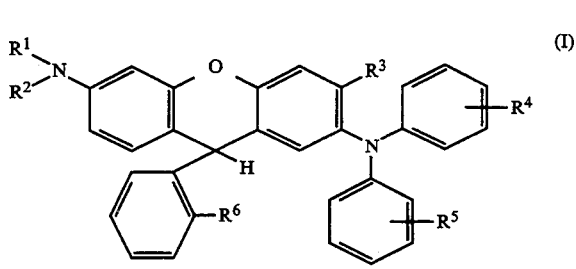

wherein $R^1$ and $R^2$, which are the same or different, each represents a hydrogen atom, an alkyl group, an aralkyl group, or an aryl group; $R^3$ represents a hydrogen atom, an alkoxy group, an aryloxy group, an alkylthio group, or an arylthio group; one of $R^4$ and $R^5$ each represents a hydrogen atom, an alkyl group, or an alkoxy group and the other one of $R^4$ and $R^5$ represents a trifluoromethyl group, an arylsulfonyl group, an alkylsulfonyl group or an N-substituted sulfamoyl group where $R^3$ represents a hydrogen atom, and $R^4$ and $R^5$ each represents a hydrogen atom, an alkyl group or an alkoxy group where $R^3$ is an alkoxy group, an aryloxy group, an alkylthio group or an arylthio group; and $R^6$ represents a hydrogen atom, an alkyl group, or a substituted carbonyl group; and wherein $R^1$ and $R^2$, may be bonded to each other to form a ring which may include an unsaturated bond or a hetero ring.

2. An image-forming material as in claim 1, wherein an antioxidant is further encapsulated in the microcapsule.

3. An image-forming material as in claim 2, wherein the photo-oxidizing agent is present in a molar ratio of from 10:0.001 to 10:2 with respect to the antioxidant.

4. An image-forming material as in claim 2, wherein the photo-oxidizing agent is present in a molar ratio of from 10:0.01 to 10:1 with respect to the antioxidant.

5. An image-forming material as in claim 1, wherein the leuco dye is present in a molar ratio of from 10:1 to 1:10 with respect to the photo-oxidizing agent.

6. An image-forming material as in claim 5, wherein the leuco dye is present in a molar ratio of from 2:1 to 1:2 with respect to the photo-oxidizing agent.

7. An image-forming material as in claim 1, wherein the microcapsule has a volume average diameter of 20 μm or less.

8. An image-forming material as in claim 7, wherein the microcapsule has a volume average diameter of 4 μm or less.

9. An image-forming material as in claim 1, wherein the reducing agent is present in an amount of from 1 to 100 moles per mole of the photo-oxidizing agent.

10. An image-forming material as in claim 9, wherein the reducing agent is present in an amount of from 5 to 20 moles per mole of the photo-oxidizing agent.

* * * * *